US00RE44430E

(19) United States
(12) Reissued Patent
Beasom

(10) Patent Number: US RE44,430 E
(45) Date of Reissued Patent: Aug. 13, 2013

(54) PMOS DEPLETABLE DRAIN EXTENSION MADE FROM NMOS DUAL DEPLETABLE DRAIN EXTENSIONS

(75) Inventor: James D. Beasom, Melbourne, FL (US)

(73) Assignee: Intersil Americas Inc., Milpitas, CA (US)

(21) Appl. No.: 13/291,302

(22) Filed: Nov. 8, 2011

Related U.S. Patent Documents

Reissue of:
(64) Patent No.: 7,829,954
Issued: Nov. 9, 2010
Appl. No.: 12/372,172
Filed: Feb. 17, 2009

U.S. Applications:
(62) Division of application No. 11/361,361, filed on Feb. 24, 2006, now Pat. No. 7,547,592.

(60) Provisional application No. 60/688,708, filed on Jun. 9, 2005.

(51) Int. Cl.
*H01L 29/72* (2006.01)
*H01L 21/8238* (2006.01)

(52) U.S. Cl.
CPC ..... *H01L 21/823807* (2013.01)
USPC ..... 257/369; 257/335; 257/344; 257/371; 257/401; 257/408

(58) Field of Classification Search
CPC ..... H01L 21/823807
USPC ..... 257/335, 344, 369, 371, 401, 408
See application file for complete search history.

(56) References Cited

U.S. PATENT DOCUMENTS

| | | | |
|---|---|---|---|
| 4,823,173 | A | 4/1989 | Beasom |
| 5,264,719 | A | 11/1993 | Beasom |
| 5,338,960 | A | 8/1994 | Beasom |
| 6,894,349 | B2 | 5/2005 | Beasom |
| 6,974,753 | B2 | 12/2005 | Beasom |
| 2003/0102512 | A1 | 6/2003 | Chatterjee |

*Primary Examiner* — Edward Wojciechowicz
(74) *Attorney, Agent, or Firm* — Fogg & Powers LLC

(57) ABSTRACT

In accordance with an embodiment of the invention, there is an integrated circuit device having a complementary integrated circuit structure comprising a first MOS device. The first MOS device comprises a source doped to a first conductivity type, a drain extension doped to the first conductivity type separated from the source by a gate, and an extension region doped to a second conductivity type underlying at least a portion of the drain extension adjacent to the gate. The integrated circuit structure also comprises a second complementary MOS device comprising a dual drain extension structure.

29 Claims, 9 Drawing Sheets

(NEW)

(NEW)

(NEW)

PMOS DEPLETABLE DRAIN EXTENSION MADE FROM NMOS DUAL DEPLETABLE DRAIN EXTENSIONS

Matter enclosed in heavy brackets [ ] appears in the original patent but forms no part of this reissue specification; matter printed in italics indicates the additions made by reissue.

CROSS-REFERENCE TO RELATED APPLICATION

This application claims priority to U.S. Divisional application Ser. No. 11/361,361 filed on Feb. 24, 2006 *now U.S. Pat. No. 7,547,592* which claims benefit of U.S. Provisional Patent Application Ser. No. 60/688,708 filed on Jun. 9, 2005, the disclosure of which is incorporated by reference herein in its entirety.

FIELD OF THE INVENTION

The subject matter of this application relates to transistors. More particularly, the subject matter of this application relates to PMOS and NMOS devices with depletable drain extensions.

BACKGROUND OF THE INVENTION

Conventional structures used to build high voltage MOS devices, such as PMOS device 100 shown in FIG. 1, include a P drain extension 110 that extends from the drain edge of the gate 112 to a P+ drain contact 120. The P drain extension 110 is designed so that under reverse drain to body bias, the drain extension 110 totally depletes before breakdown occurs at the drain extension to body junction under the edge of the gate 112. In this design, the P+ drain contact 120 is separated from the high field induced by the gate 112, which is also separated from the drain body junction by a thin gate oxide 130. This makes it possible for the PMOS device 100 to achieve a higher breakdown voltage.

Some applications, however, call for both high voltage NMOS and high voltage PMOS devices on the same structure. One conventional approach has been to make the NMOS using a quasi-vertical diffused metal-oxide semiconductor device (DMOS). A quasi-vertical DMOS device, however, requires a heavy doped buried layer, a sinker, and a thick epitaxial layer with closely controlled resistivity and thickness. These structures increase the complexity and cost of processing.

Another conventional approach has been to build both NMOS and PMOS devices with depletable drain extensions. It is undesirable, however, to use the simple drain extension 110 structure illustrated in FIG. 1 for both device types because this requires both P- and N-type lightly doped islands in which to form the two types of devices. This conventional approach also increases complexity and cost of processing.

Thus, there is need to overcome these and other problems of the prior art associated with high voltage structures that call for both high voltage NMOS and high voltage PMOS devices.

SUMMARY OF THE INVENTION

In accordance with an embodiment of the invention, there is an integrated circuit device having a complementary integrated circuit structure comprising a first MOS device. The first MOS device comprises a source doped to a first conductivity type, a drain extension doped to the first conductivity type separated from the source by a gate, and an extension region doped to a second conductivity type underlying at least a portion of the drain extension adjacent to the gate. The integrated circuit structure also comprises a second complementary MOS device comprising a dual drain extension structure.

In accordance with another embodiment there is a complementary integrated circuit structure. The complementary integrated circuit comprises a first MOS device having a first source doped to a first conductivity type and a single drain extension separated from the first source by a first gate. The complementary integrated circuit also includes a second complementary MOS device having a second source doped to a second conductivity type and a dual drain extension separated from the second source by a second gate.

In accordance with another embodiment there is a method of making a complementary integrated circuit structure. The method comprises forming a first drain extension and a second drain extension from a first layer doped to a first conductivity type in a substrate, forming a first extension region under the first drain extension and forming a second extension region under the second drain extension, wherein the first extension region and the second extension region are formed from a second layer doped to a second conductivity type, and forming a first source and a second source in the substrate. The method also includes forming a gate of a first MOS device and a gate of a second complementary MOS device over the substrate, wherein the gate of the first MOS device is formed between a portion of the first layer and the first source, and wherein the gate of the second MOS device is formed between a portion of the first layer and the second source, and further wherein the second MOS device is a dual drain extension device.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIGS. 2-5 depict exemplary methods and devices for use in forming complementary drain extended MOS devices. According to various embodiments, a dual drain extension device, such as that illustrated in FIG. 2 can be used for one type of device (for example an NMOS) and a single drain extension device can be used for the second, complementary type of device (for example a PMOS). Other examples of dual depleteable drain extension devices are described in U.S. Pat. Nos. 4,823,173; 5,338,960; and 5,264,719, which are incorporated by reference in their entirety herein.

Figure 1:
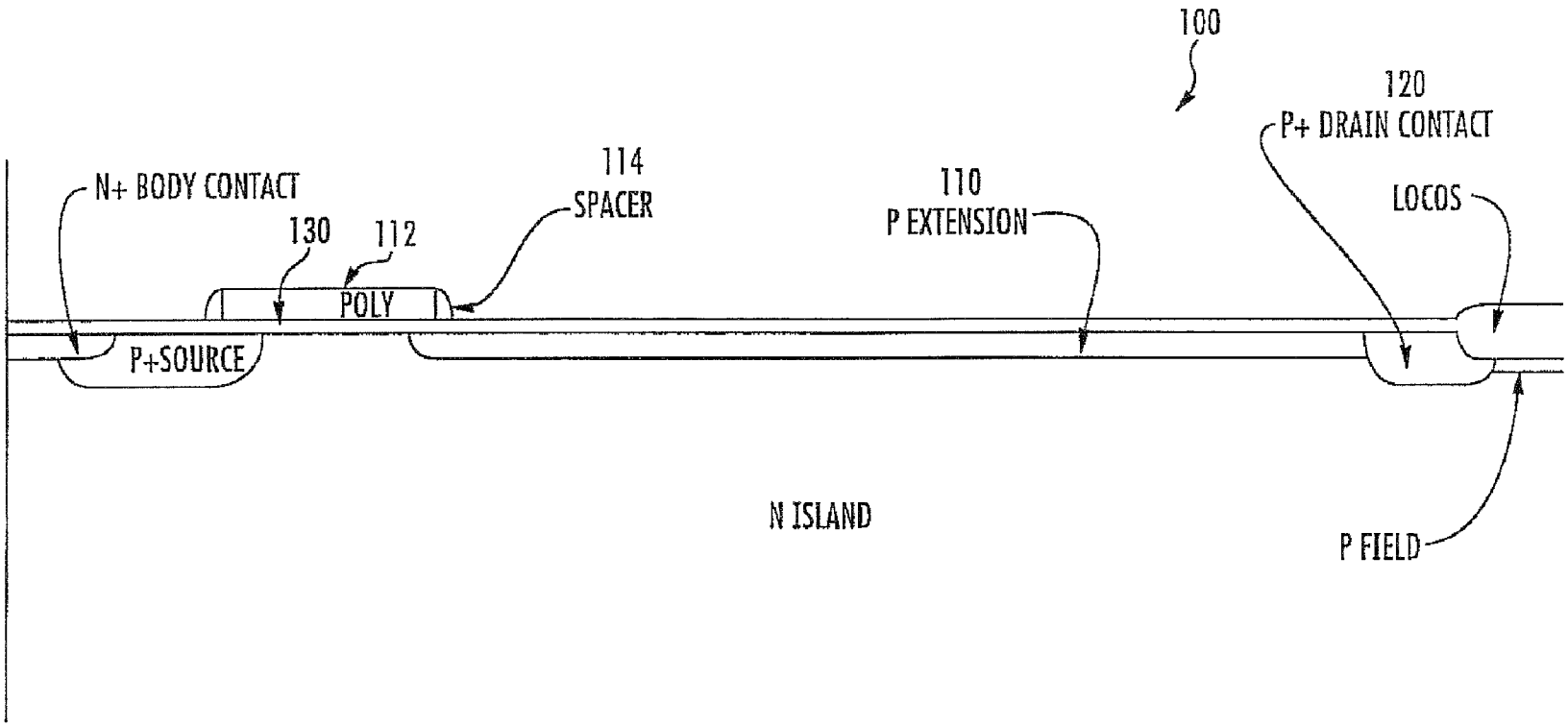
FIG. 1 RELATED ART
FIG. 1 is schematic diagram of a conventional PMOS device with a drain extension.
Figure 2:
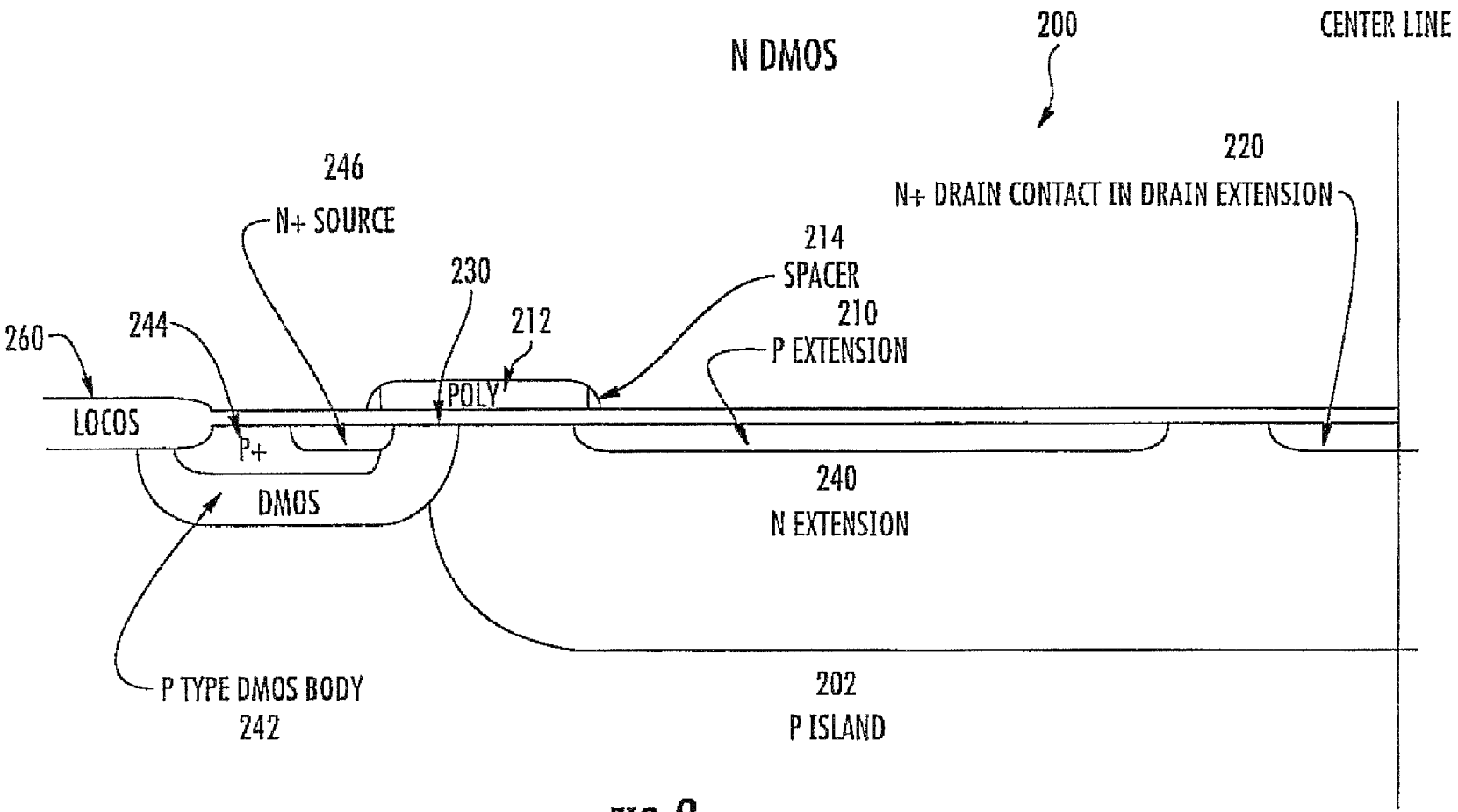
FIG. 2 is a schematic diagram of an N DMOS device of an integrated circuit device having a drain extension region according to various embodiments of the present invention.

FIG. 2 shows an NMOS device 200 formed in a P-type substrate 202. The NMOS device 200 also comprises a P-type drain extension 210 surrounded by an N-type extension 240. The NMOS device 200 also includes a gate 212 having sidewall spacers 214, an N+ drain contact 220, a gate oxide 230, a DMOS body 242, a P+ body contact 244, an N+ source 246, and a field region 260 such as LOCOS, STI, and/or other structures as will be known in the art adjacent to the P-type drain extension.

According to various embodiments, a PMOS device complementary to the NMOS device 200 can be made without adding complexity to the process. In particular, complementary devices can be made in the same substrate without having to provide separate islands doping types for each device. Moreover, each of the complementary devices can include drain extensions where both drain extensions are made with the same layer. Referring to FIG. 2, for example, a complementary PMOS device can be fabricated to have a P-type drain extension made from the same layer that forms the P-type drain extension 210 in the NMOS device 200. Still further, the complementary PMOS device can include an N-type layer under the P-type drain extension made from the same layer used to form the N-type extension 240 in the NMOS device 200. Additionally, the P+ layer used to form the various P+ features of the NMOS device can be used to form the various P+ features in the PMOS device. Similarly, N+ layer used to form the various N+ features of the NMOS device can be used to form the various N+ features in the PMOS device. Thus, the complementary devices can have common P+ and N+ layers. According to various embodiments, the layers can be formed by masked ion implantation to set the doping levels. The final junction depths can be set by diffusion of the implanted layers. According to some embodiments, the P-type substrate, or island, can be dielectrically isolated using, for example, bonded wafer technology. Further, in some cases the substrate can include a diffused P-type back layer to increase the integrated does to insure that the island never totally depletes. Net doping for the N-type extension 240 can be about 1 E12 ions/cm$^2$ to about 3E12 ions/cm$^2$ and in some embodiments about 2E12 ions/cm$^2$; for the P-type extension 210 net doping can be about 5E11 ions/cm$^2$ ions/cm$^2$ to about 1.5E12 ions/cm$^2$ and in some embodiments about 1E12 ions/cm$^2$. Further, P+ layer 244 can have a resistivity of about 3 ohms/square to about 100 ohms/square, in some embodiments about 5 ohm/square to about 75 ohm/square, and in some embodiments about 50 ohms/square, N+ layer 246 can have a resistivity of about 3 ohms/square to about 100 ohms/square, and in some embodiments about 5 ohms/square to about 75 ohms/square and in some embodiments about 20 ohms/square; NMOS body 242 can have a resistivity of about 700 ohms/square. Still further, P-type substrate 202 can have a doping of about 1E14 ions/cm$^3$ and gate oxide 230 can have a thickness of about 500 Å.

Accordingly, various single drain extension device designs can be combined with the dual drain extension device 200 shown in FIG. 2 to form a complementary device structure.

Figure 3:
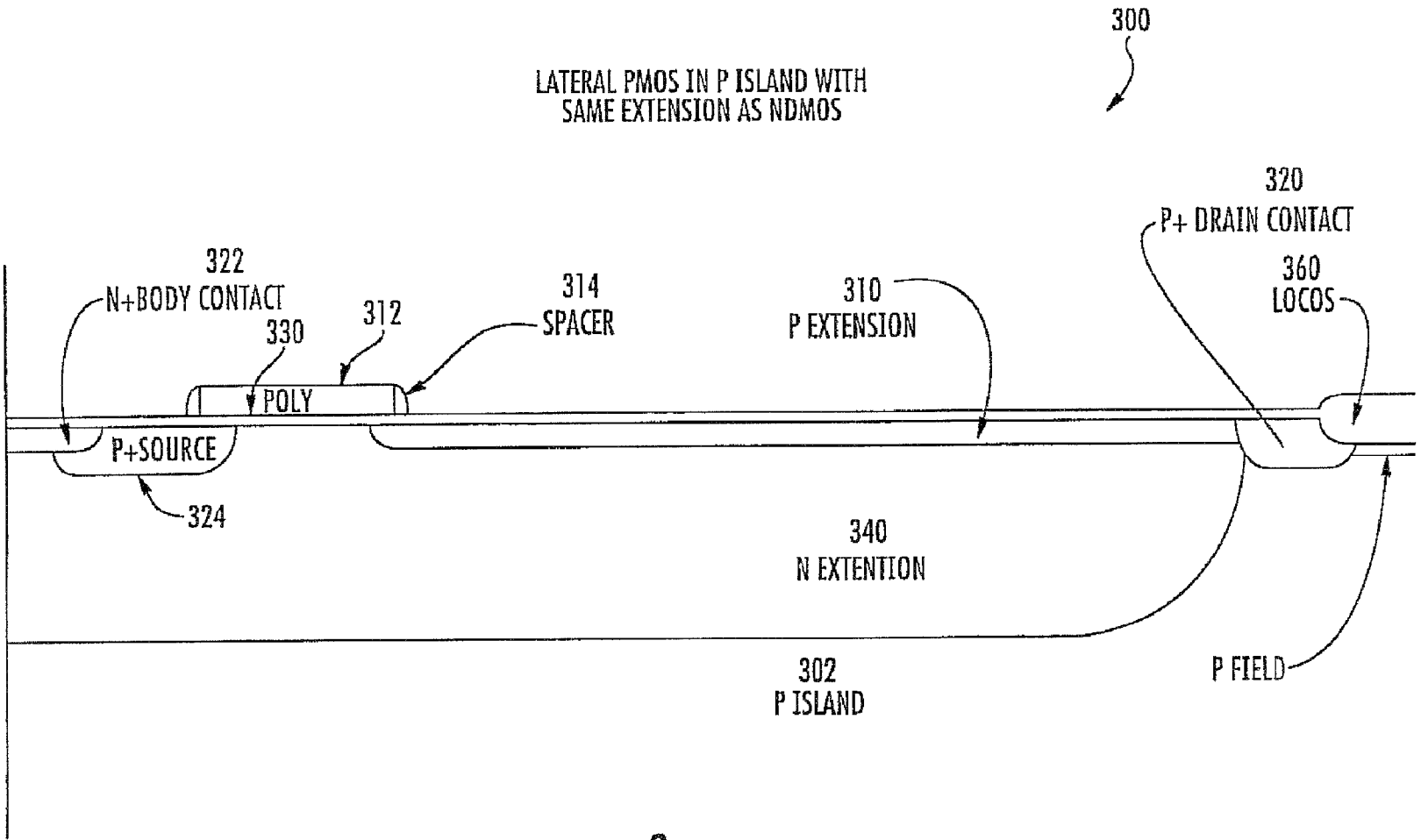
FIG. 3 is a schematic diagram of a PMOS device of an integrated circuit device having a drain extension region according to various embodiments of the present invention.

According to various embodiments a complementary PMOS device 300 is shown in FIG. 3. The PMOS device 300 can be a single drain extension device used in conjunction with the dual drain extension device 200 shown in FIG. 2 to form a complementary device structure. The PMOS device 300 can comprise a doped P-type substrate 302, a P-type drain extension 310, a gate 312, sidewall spacers 314, a P+ drain contact 320, an N+ body contact 322, a P+ source 324, a gate oxide 330, an N-type extension 340 surrounding the P-type drain extension 310, and field regions 360, such as LOCOS, STI, and/or other structures as will be known in the art adjacent to the P-type drain extension.

As indicated, the PMOS device 300 can be made in the same P-type substrate in which the complementary NMOS structure 200 is made. Referring to FIGS. 2 and 3, the P-type drain extension 310 can be made with the same P layer that is used to make the P-type drain extension 210 of the dual drain extension of the NMOS device 200. Still further, the N-type extension 340 under the P-type drain extension 310 in the PMOS device 300 can be the same layer used to form the N-type extension 240 in the NMOS device 200.

According to various embodiments, the P-type drain extension 310 can extend beyond the N-type extension 340 onto the P+ drain contact 320 and/or the P-type substrate. The P+ drain contact 320 can also be spaced apart from the N-type extension 340. The portion of the N-type extension 340 under the P+ source 324, the N+ body contact 322, and the gate 312, between the P+ source 324 and the P-type drain extension 310, can be the N-type body of the PMOS 300. For example, in the devices of FIGS. 3 and 4 (described below), the depletable N-type extension portion of the PMOS and its body can both be made using the same N layer. Further, that layer can also be used as the N-type extension in a drain extension NMOS, such as, for example, the device 200 illustrated in FIG. 2.

According to various embodiments, the P+ layer used as the P+ body contact 244 in the NDMOS device 200 can be used as the P+ source 324 and the P+ drain contact 320 in the PMOS device 300. Further, the N+ layer used as the N+ body contact 322 of the PMOS device 300 can be used as the N+ drain contact 220 and N+ source 246 in the NDMOS 200. Using this arrangement, high voltage devices can be fabricated.

According to various embodiments, the P-type drain extensions of the devices can be formed after sidewall spacers have been formed. In this case, the P-type drain extensions can be very shallow such that they do not extend the entire way under the sidewall spacers so as to not reach the drain edge of the gate. This can prevent the P-type drain extension 310 from making an electrical connection to the channel, as called for by the current carrying extension in the PMOS device 300. When the extension is formed after the sidewall spacers, the ohmic connection of the structure can be achieved by adding a P-link layer adjacent to the drain edge of the gate, as described below.

Figure 4:
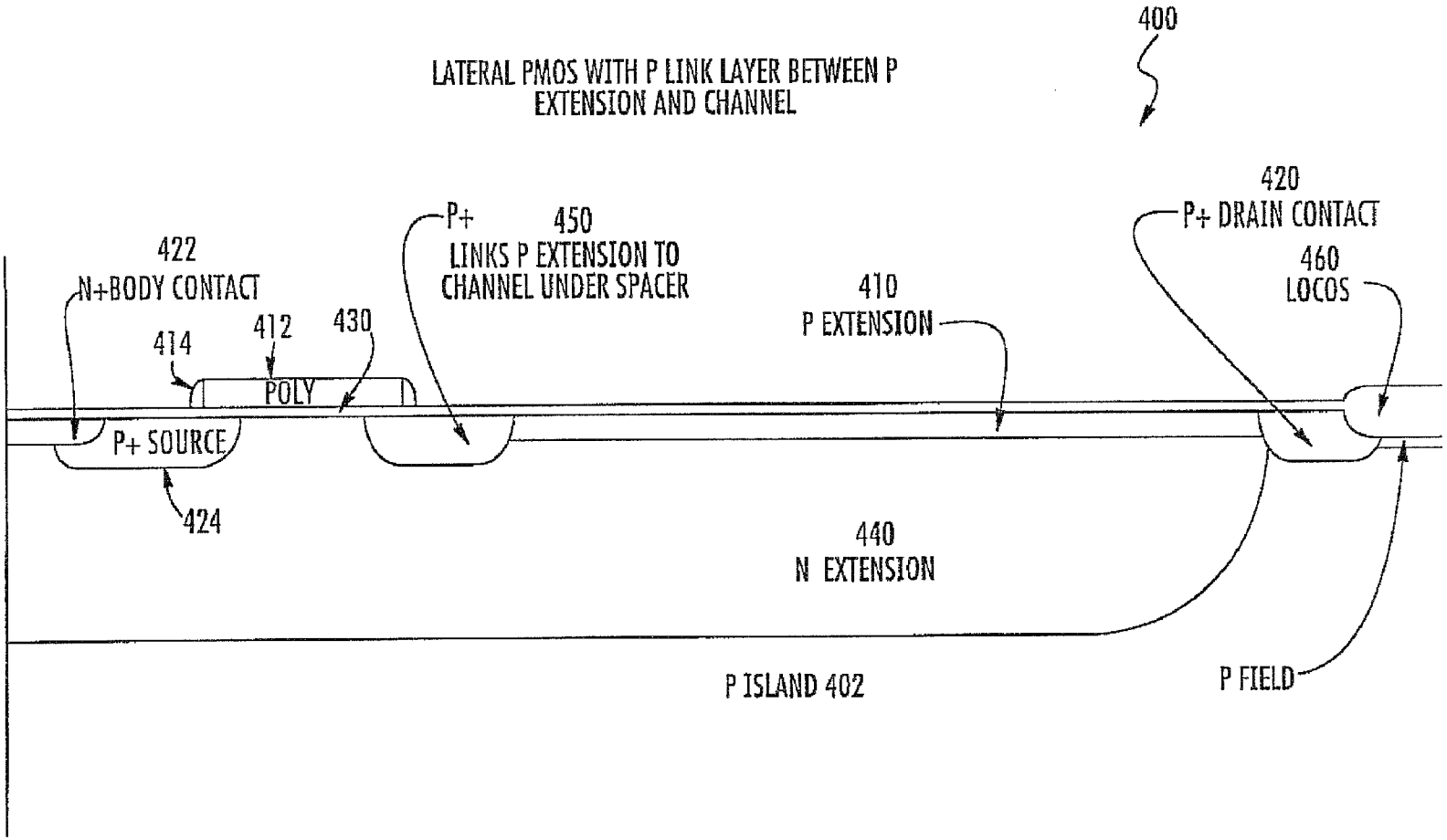
FIG. 4 is a schematic diagram of a PMOS device of an integrated circuit device having a drain extension region according to various embodiments of the present invention.

For example, FIG. 4 shows a PMOS device 400 comprising a P-type substrate 402, a P-type drain extension 410, a gate 412 having sidewall spacers 414, a P+ drain contact 420, an N+ body contact 422, a P+ source 424, a gate oxide 430, an N-type extension 440 surrounding the P-type drain extension 410, and field regions 460, such as LOCOS, STI, or other structures as will be known in the art adjacent to the P-type drain extension. The PMOS device 400 can also include a P-link layer 450 that can enable electrical contact, or link, the P-type drain extension 410 to the channel. For example, the P-link layer 450 can contact the P-type drain extension and a channel under the gate. According to various embodiments, the P-link layer 450 can be made using an available P layer, such as the P+ source layer 424. The P-link layer can be non-depletable. However, according to various embodiments, the P-link layer can also be depletable. Moreover, the P-link layer can be in, or form a part of a current carrying layer.

According to various embodiments, the P-link layer 450 and the P-type drain extension 410 can be designed such that the drain extension totally depletes at a drain to body reverse bias below that at which the link layer to body junction under the edge of the gate breaks down. This can ensure that the addition of the P-link layer 450 does not reduce the breakdown of the MOS structure. According to various embodiments, the length of the P-link layer can be small so it does not fully contribute to setting the breakdown voltage. In some cases, breakdown voltage in depletable drain extension structures can be approximately proportional to the length of the depletable extension. According to various embodiments, the length of the P-link layer can be from about 0.5 μm to about 5.0 μm, and in some cases can be about 1.5 μm. A wide range of doses can be used, starting with the same dose as the P-type drain extension, such as ~1E12 ions/cm$^2$ and ranging up to greater than 1E15 ions/cm$^2$, as might be used for the P+ layer.

According to various embodiments, the voltage at which the P-type drain extension totally depletes can be set largely by the integrated dose of the P-type drain extension and by the doping level of the P-type and N-type extensions. The integrated dose of the P-type drain extension can be selected so as to limit the electric field at which the extension totally depletes so that depletion occurs before breakdown between the P-type drain extension and the N-type extension occurs. For some embodiments, the P extension doping can be about 1E12 ions/cm$^2$. This can yield a one dimensional electric field at a breakdown of about 1.6E5 V/cm.

According to various embodiments, the electric field can be obtained from a first integration of Poisson's equation in one dimension $$E=qN_a x_1/\in \quad [1]$$

where E is the electric field, q is the electron charge, $N_a$ is the doping of P-type drain extension (in this case the doping is assumed to be uniform), $x_1$ is the thickness of P-type drain extension, and $\in$ is the dielectric constant of silicon.

Further, $$Q=N_a x_1 \quad [2]$$

where Q is the integrated dose of the P-type extension (in units of ions/cm$^2$). After substituting:

$$E=qQ/\in \quad [3]$$

According to various embodiments, the absolute voltage in the depletion layer on one side of the junction can be given by the second integral of Possion's equation;

$$V_p=qN_a x_1^2/2\in=qQ^2/2\in N_a \quad [4]$$

For the P-type drain extension side, $$V_n=qN_d t_n^2/2\in \quad [5]$$

where $V_n$ is the voltage in the depletion layer in the N-type extension, $t_n$ is the width of depletion layer in N-type extension at a voltage that just totally depletes the P-type extension, and $N_d$ is the doping level of the N extension (which in this case is assumed to be uniform). The integrated dose in the two sides of a depletion layer are equal, therefore:

$$x_1 N_a=t_n N_d \quad [6]$$

Solving for $t_n$:

$$t_n=x_1 N_a/N_d \quad [7]$$

and substituting into the expression for $V_n$:

$$V_n=qN_d[(x_1 N_a)/(N_d)]^2/2\in=q(x_1 N_a)^2/N_d 2\in \quad [8]$$

Substituting $$x_1=Q/N_8 \quad [9]$$

$$V_n=qN_a^2(Q/N_a)^2/N_d 2\in=qQ^2/N_d 2\in \quad [10]$$

And the total applied voltage is the sum of the voltages in the depletion layers on the two sides of the junction:

$$V = V_n + V_p \quad [11]$$

$$= qQ^2/N_d 2\varepsilon + qQ^2/N_a 2\varepsilon \quad [12]$$

$$= qQ^2/2\varepsilon((1/N_d) + (1/N_a)). \quad [13]$$

Figure 5:
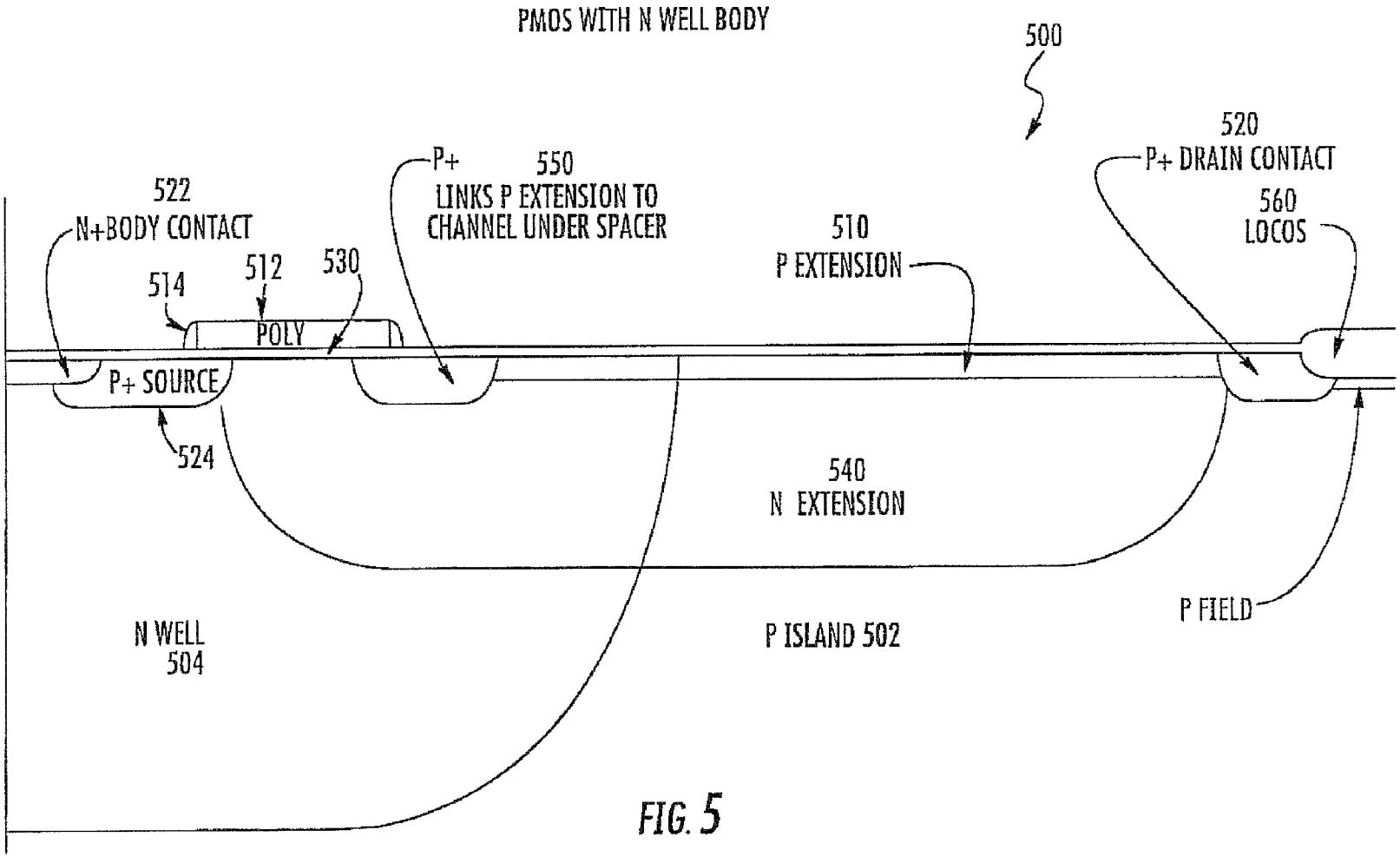
FIG. 5 is a schematic diagram of a PMOS device of an integrated circuit device having a drain extension region according to various embodiments of the present invention.

According to various embodiments, another PMOS device 500 is shown in FIG. 5. PMOS device 500 can comprise a P-type substrate 502, an N-type well 504, a P-type drain extension 510, a gate 512 having sidewall spacers 514, a P+ drain contact 520, an N+ body contact 522, a P+ source 524, a gate oxide 530, an N-type extension 540 surrounding the P-type drain extension 510, a P+ link layer 550 that links the P-type drain extension 510 to the channel under the sidewall spacer 514, and field regions 560, such as LOCOS, STI, and/or other structures as will be known in the art adjacent to the P-type drain extension.

According to various embodiments, the PMOS device 500 can be formed in the well 504 formed from an N-type extension 540. Further, according to various embodiments, the well 504 can be the body of the PMOS device. Moreover, the PMOS device 500 can be made using a layer that is also used to make the bodies of low voltage PMOS devices, i.e., an N well. The well 504 can also be a shallow N body layer optionally self aligned to the gate, similar to that of the NDMOS body 242 shown in FIG. 2. The depletable N-type extension layer 540 can also be used as part of the body in the region under a portion, or most of the gate 512. According to various embodiments, the N-type extension 540 can provide an N-type layer under the P-type drain extension 510 that depletes the P extension under reverse drain to body voltage. According to various embodiments, the N-type extension 540 can be formed from the same N-type extension that is used to form the N-type extension in the complementary NMOS device.

For example, when combining the PMOS device 500 shown in FIG. 5 with the NMOS device 200 of FIG. 2, the N-type extension 240 can also form the N-type extension 540. The performance of this complementary structure can be influenced by the N-type extension 540 being designed to totally deplete in the NMOS. To alleviate a P substrate 502/P+ source 524 punch through voltage limitation on the breakdown voltage and a high pinched resistance in the N body under the source 524, the source 524 can be formed in the high voltage N-type well 504 with the P-type drain extension 510 formed over the N-type extension 540 in the extension region. According to various embodiments, the N-type extension 540 can overlap the N-type well 504 in the region where the source 524 and/or channel under gate 512 is formed. In some cases, the N-type extension 540 can be extended across the entire N-type well 504 to achieve minimum pinched resistance under the source 524. The deep N-type well 504 can have its perimeter surrounded by the P-type drain extension in the N extension layers that will act as a depletable junction termination extension region to reduce junction curvature limited breakdown.

According to various embodiments, NDMOS devices, such as those described herein, can have breakdown voltages (BVDSS) ranging from about 50V to about 1200V. According to some embodiments, NDMOS devices, such as those described herein, can have breakdown voltages ranging from about 150V to greater than about 800V. Complementary devices, such as the PMOS devices described herein, can be made to operate over the same range of voltages. Still further, devices, such as those described herein, can have improved specific ON resistance, which can vary with breakdown voltage. For example, NDMOS devices disclosed herein having a breakdown voltage of about 250V can have a specific on resistance of about 3.2 $\Omega mm^2$. Complementary PMOS devices, made with a breakdown voltage of about 250V can have a specific ON resistance of about 9.6 $\Omega mm^2$.

Some conventional MOS devices that include dual drain extensions have drain contact diffusions that can be formed in the body layer of the device. The drain body breakdown voltage (BVDSS) in such a device, however, can be influenced by the plane breakdown of the drain to body (or well) junction. This can also be the case where a feature that completely eliminates junction curvature is included as part of the device. Plane breakdown is set primarily by the doping of the lightly doped side (the drain) of the junction. Breakdown increases as doping decreases.

Body doping can be constrained to a relatively high value by the need to set threshold voltage. Typical body doping for a PMOS device is about 1E15 $cm^{-3}$ for a gate oxide ~/>1000 Å. The plane junction breakdown with this doping is about 250V. Thinner gate oxides, such as, for example, about 400 Å, can require body doping ~/>1E16 $cm^{-3}$, for which the plane junction breakdown is about 50V. NMOS devices require higher body doping for a given gate oxide thickness and threshold voltage than do PMOS devices, so their breakdown voltage can be more limited than in a PMOS device.

The drain to body junction of devices described herein, however, can be the junction between the N-type extension, such as N-type extension 340 or 440 that form both body and depletable extension regions, as shown in FIGS. 3 and 4, respectively, or the N body 504 and the depletable N-type extension 540 to the P-type substrate, such as 302, 402, or 502 that is the drain. According to various embodiments, the substrate can include an island having doping this is made as low as desired to set the junction breakdown to the desired value that can exceed 1000V. The planar breakdown limit of the junction can be removed by surrounding the perimeter of the junction with a region of P-type drain extension over N-type extension. In this case, both totally deplete at a drain to body voltage below that at which breakdown in the planar edge of the junction is reached. For example, the P-type drain extension, such as 310, 410, or 510, shown in FIGS. 3-5, respectively, to the N-type extension and/or N well can also be part of the drain to body junction. In this case, the breakdown voltage can be made high by designing both the N extension and the P extension to totally deplete at a voltage lower than that at which the junctions of which they form one side would breakdown.

Figure 6:
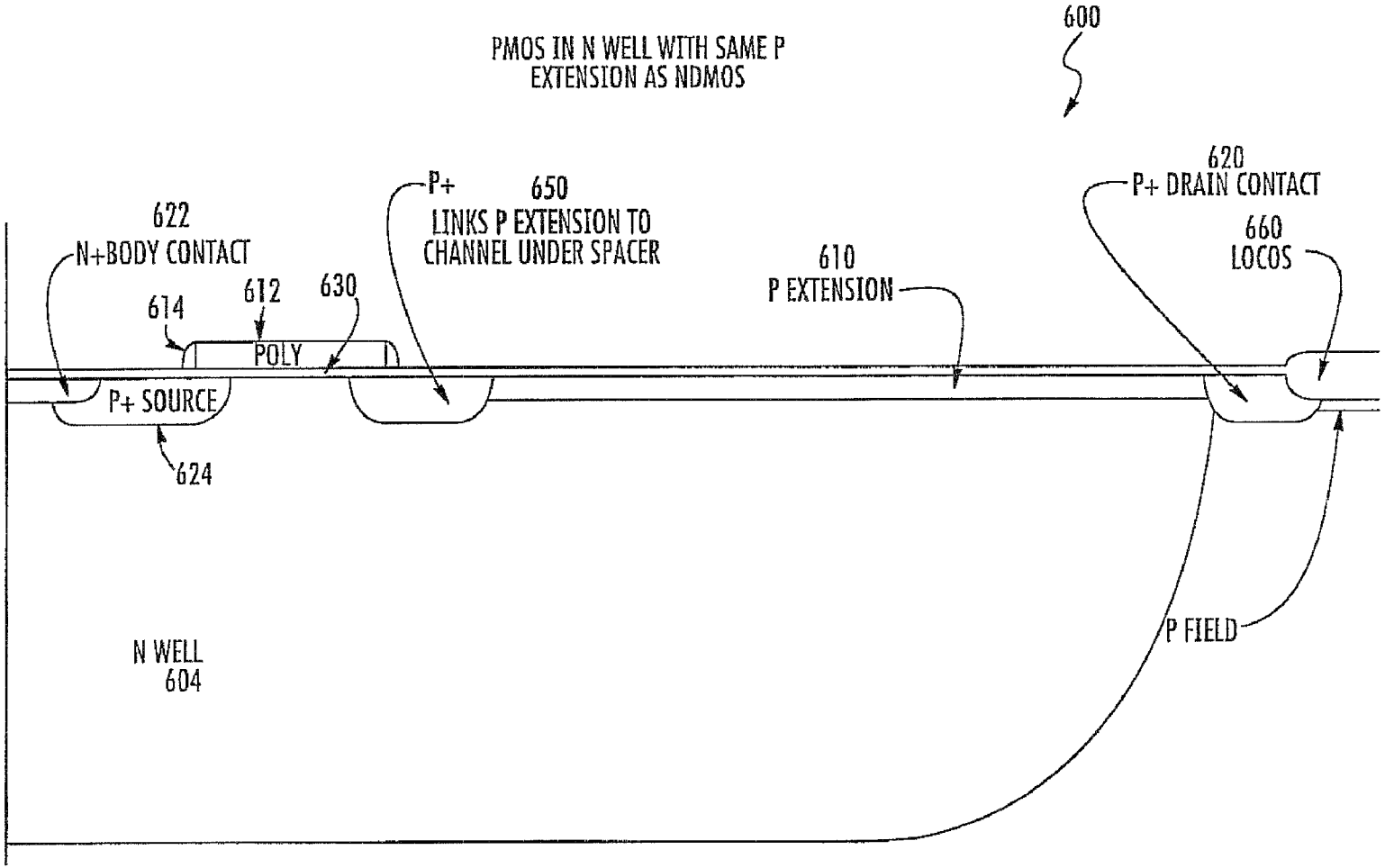
FIG. 6 is a schematic diagram of a PMOS device of an integrated circuit device having a drain extension region according to various embodiments of the present invention.

FIG. 6 shows another PMOS device 600 according to various embodiments of the invention. PMOS device 600 can comprise a P-type substrate 602, an N-type well 604, a P-type drain extension 610, a gate 612 having sidewall spacers 614, a P+ drain contact 620, an N+ body contact 622, a P+ source 624, a gate oxide 630, a P+ link layer 650 that links the P-type drain extension 610 to the channel under the sidewall spacer 614, and field regions 660, such as LOCOS, STI, and/or other structures as will be known in the art adjacent to the P-type drain extension.

According to various embodiments, in the PMOS device 600, source and drain extension 610 can be formed in the N-type well 604 without the need for an N-type extension. The N-type well 604 doping profile can be adjusted such that it totally depletes the P-type extension 610.

It is contemplated to invert all conductivity types explicitly described herein to produce a dual drain extension PMOS and a single drain extension NMOS using the structures described above.

Figure 7A:
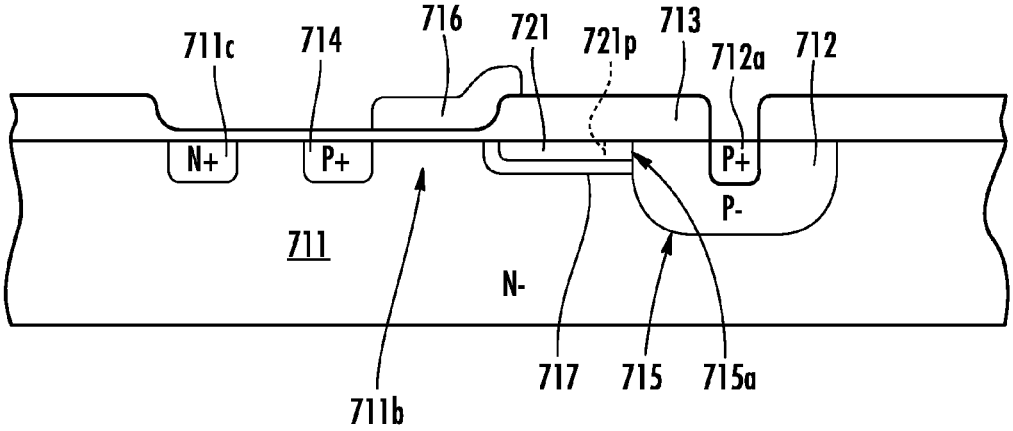
*FIGS. 7a and 7b is a cross-section of an integrated circuit device according to various embodiments of the present invention.*
Figure 7B:
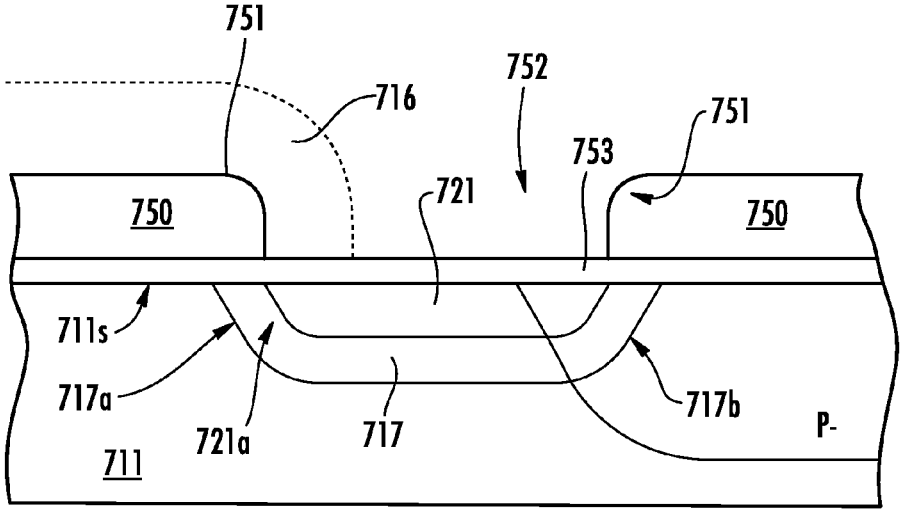

*FIGS. 7a and 7b show an MOS device where $P^+$ drain contact 712a is formed in $P^-$ type drain 712, $P^+$ source 714 is formed in the $N^-$ body 711 and $N^+$ body contact 711c is provided in the $N^-$ body 711. The MOS channel region 711b is in the $N^-$ body 711 below the MOS gate 716 and Gate Oxide 713. The N type top gate 721 is provided along the surface 711s of the body 711 above the P type drift region 717 which acts as a JFET channel. The lateral edge or peripheral edge of both the top gate 721 and drift region 717 extend to the drain-to-body junction 715 and preferably terminate at the junction 715. It is noted that situations may exist where the doping level in the top gate may be sufficiently high so as to render it desirable to provide a shorter top gate having a lateral extension which stops short of contacting the junction 715. In this case care should be taken to insure that any nondepleted portion of the top gate does not result in a breakdown of the top gate-to-drift region junction 717a. Proper doping of the top gate 721 will generally be a sufficient preventative step. Dashed line 721p designates the peripheral edge of top gate 721 in an embodiment where the top gate does not extend all the way to the junction 715.*

The structure of FIG. 7a provides reduced ON resistance in the JFET channel 717. The reduction in ON resistance is accomplished by providing a structure which can accommodate increased drift region doping without suffering from reduced body-to-drain breakdown. This is possible because of the provision of the top gate 721. The top gate-to-channel depletion layer which holds some channel charge when reverse biased, is in addition to the channel charge held by the bottom gate to channel depletion layer of the prior art. This additional channel charge, in the form of ionized channel impurity atoms, causes the reduction in channel resistance. It is possible to provide more than twice the doping level previously acceptable due to the additional ability to hold channel change. Thus, for a drift region 717 having a doping of $1\times10^{12}$ boron atoms per square centimeter in a bottom gate arrangement, the present invention will permit $2\times10^{12}$ boron atoms per square centimeter. Thus, the ON resistance will be only half the ON resistance of the prior arrangement.

In order to optimize performance of the structure of the invention, the top gate 721 must be designed differently than an ordinary JFET gate. Top gate 721 should become totally depleted at a body-to-drain voltage of less than the breakdown voltage of the top gate-to-drain junction 715a. Since top gate 721 is connected to body 711, the voltage at the top gate-to-drain junction 715a will equal the voltage of the body-to-drain junction 715 voltage and the top gate-to-drain breakdown voltage should be greater than the voltage at which top gate 721 becomes totally depleted. Additionally, the top gate 721 must totally deplete before the body 711 to channel 717 depletion layer reaches the top gate 721 to channel 717 depletion layer to thereby assure that a large top gate 721 to drain 712 voltage is not developed by punch-through action from the body 711. An ordinary JFET gate never totally depletes regardless of operating conditions.

In addition to the above described characteristics of the device of the invention, it is also necessary to insure that the channel of the JFET drift region 717 contacts the inversion layer MOS surface channel. This can be accomplished as shown in FIG. 7b where an implant mask 750 having a tapered edge 751 is provided over the body 711. An implant aperture 752 is provided in mask 750 at the location where the P drift region 717 and N top gate 721 are to be formed. The aperture 752 is shown as exposing the protective oxide 753. Ion implantation is not substantially affected by the oxide 753 due to the oxide thickness of only about 0.1-0.2 micrometers, yet the oxide provides surface passivation for the underlying body 711.

The drift region 717 is ion implanted and, because of the graduated thickness of the implant mask 750 (along the edge 751), the depth of the implanted drift region 717 is graduated or tapered. In the illustration, a fairly good rounding of the drift region 717 occurs at the peripheral edges or extremities 717a, 717b of the region 717. The curved extremity 717a is of interest because at this location the channel of the JFET drift region 717 contacts the surface 711s of body 711 beyond the end 721a of top gate 721 and is desirably beneath the gate 716 of the MOS device. The top gate 721 may be ion-implanted using the implant mask 750 but at an energy level which results in a shallower implantation. This tapered profile, particularly if curved, provides improved performance.

Figure 8:
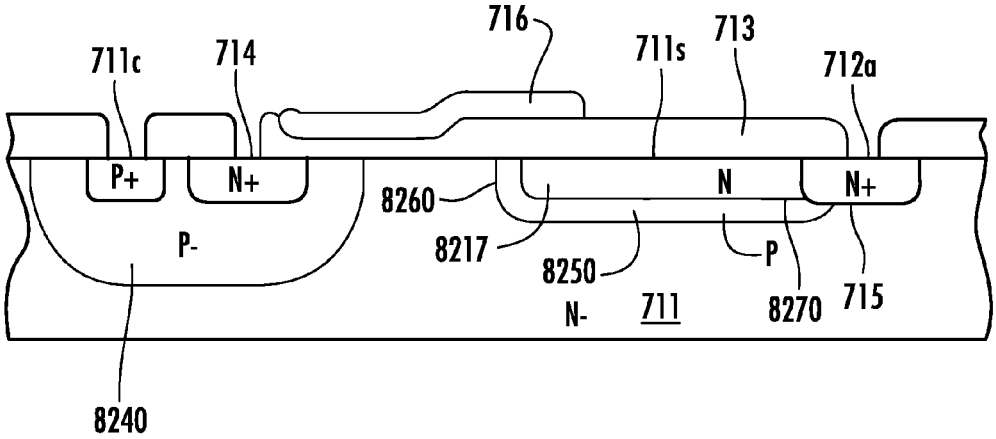
*FIG. 8 is a cross-section of an integrated circuit device according to various embodiments of the present invention.*

A further extension of the invention is illustrated in FIG. 8 which shows an LDMOS device where $N^+$ drain contact 712a is formed in an $N^-$ type substrate and an $N^+$ source 714 and $P^+$ body contact 711c are formed in a $P^-$ type body region 8240. The DMOS channel region 711b is in the $P^-$ body 8240 below the DMOS gate 716. The N type first drift region 8217 is provided along the surface 711s of the substrate 711 above a $P^-$ type separation region 8250. A second drift region 217a exists in the substrate 711 underneath the $P^-$ type separation region. The lateral edge of both the first drift region 8217 and the separation region 8250 extend from the gate 716 to the $N^+$ drain contact 712a.

The structure in FIG. 8 provides reduced ON resistance by way of the second (surface) drift region 217a. To illustrate this, consider an example in which the $N^-$ region 711 has a doping of $1\times10^{14}$ ions $cm^{-3}$. The top gate layer 8217 has an integrated doping of about $1\times10^{12}$ ions $cm^{-2}$ and is preferably not more than two microns thick while maintaining full breakdown. The thickness of the N and P layers 8217, 8250 together is preferably less than ten microns and can be less than one micron. The same integrated doping in the $N^-$ body 711 requires a thickness of 100 microns. Thus, the N and P layers 8217, 8250 respectively consume only a small fraction of the $N^-$ thickness required to provide doping equal to that portion of the N layer of the prior art device.

The lateral spacing between the drain contact 712a and the channel 711b in the device described above would be approximately 30 microns. In such a device, even if a full 100 micron thick $N^-$ body 711 were provided, it would have a higher resistance than the $N^-$ first drift region 8217 provided according to the invention. This is because the average path length of current flowing from the drain contact 712a down through the thick $N^-$ body 711 and back up to the surface edge of the channel at the drain-to-body junction would be greater than the direct path through the $N^-$ first drift region.

Maximum breakdown is achieved in the invention by providing doping densities of the N and P layers 8217, 8250 such that they become totally depleted before breakdown is reached at any point along the junctions which they form with adjoining regions and before breakdown is reached at the junction between them. To insure that this occurs, the N region 8217 should have an integrated doping not exceeding approximately $1\times10^{12}$ ions $cm^{-2}$ and the P region 8250 should have a higher integrated doping not exceeding about 1.5 to $2\times10^{12}$ ions $cm^{-2}$.

Figure 9:
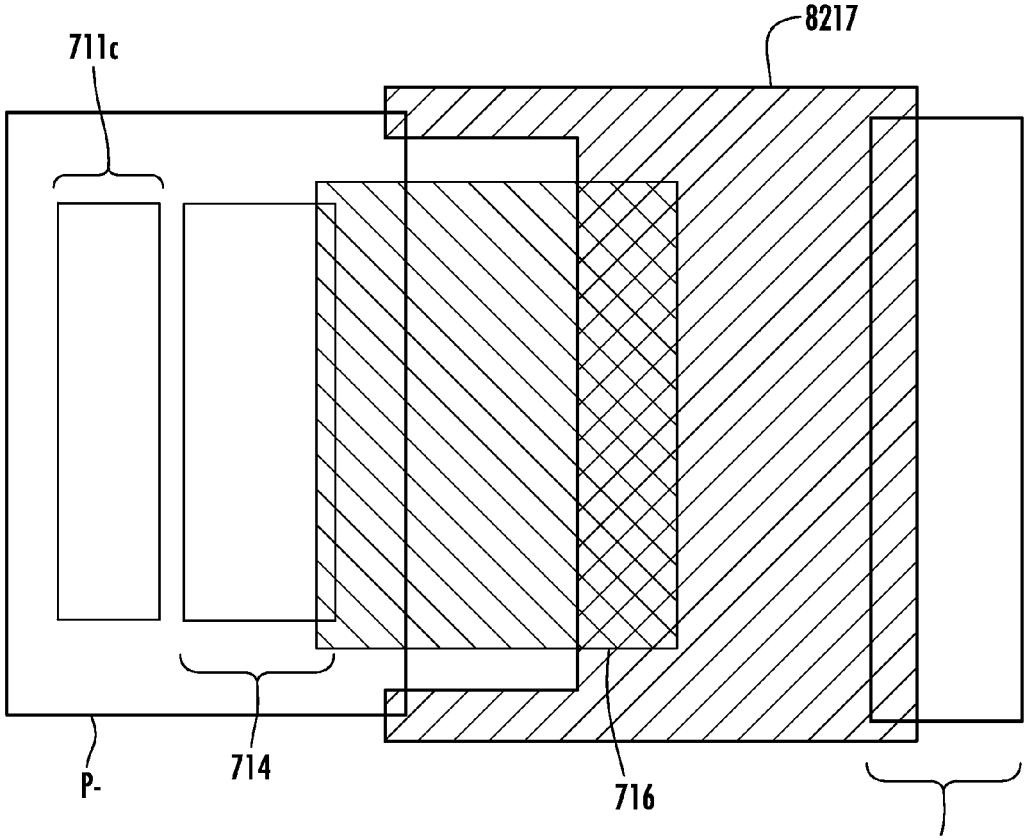
*FIG. 9 is a top-view of the device of FIG. 8 according to various embodiments of the present invention.*

To insure proper depletion of the P and N regions 8250, 8217, they must have the proper voltages applied. The N layer bias is achieved by connecting the N first drift region 8217 to the higher concentration $N^+$ drain contact 712a by overlapping the N first drift region 8217 and drain contact 712a. The P region 8250 bias is achieved by overlapping the P region 8250 with the $P^-$ body 8240 at least at one end of the channel, thereby applying the body voltage to the P layer 8250. This is illustrated in FIG. 9.

With this structure and choice of doping levels, the desired results are achieved. When a reverse bias voltage is applied to the drain-to-body junction between $P^-$ body 8240 and $N^-$ body 711, the same reverse bias appears on both the $PN^-$ junction 8260 and the PN junction 8270. Depletion layers spread up into the N first drift region 8217 and down into the $N^-$ body 711 from the P layer 8250. In a preferred embodiment, the P and N first drift region dopings are chosen such that the N layer 8217 becomes totally depleted at a lower voltage than that at which the P layer 8250 becomes totally depleted. This insures that no residual undepleted portion of the N layer 8217 is present which could reduce breakdown voltage.

As a result of the invention, the improved DMOS device provides a reduced resistance current path in the drain which does not depend on the $N^-$ doping. This allows the $N^-$ doping to be reduced to achieve a desired breakdown voltage with good manufacturing margin, while maintaining desirable low drift region resistance. In a multi-device process which includes LDMOS devices, the $N^-$ region can be adjusted to

*achieve the desired characteristics of one or more of the other device types, while the N first drift region 8217 sets the drift region 8217 resistance of the LDMOS.*

Figure 10:
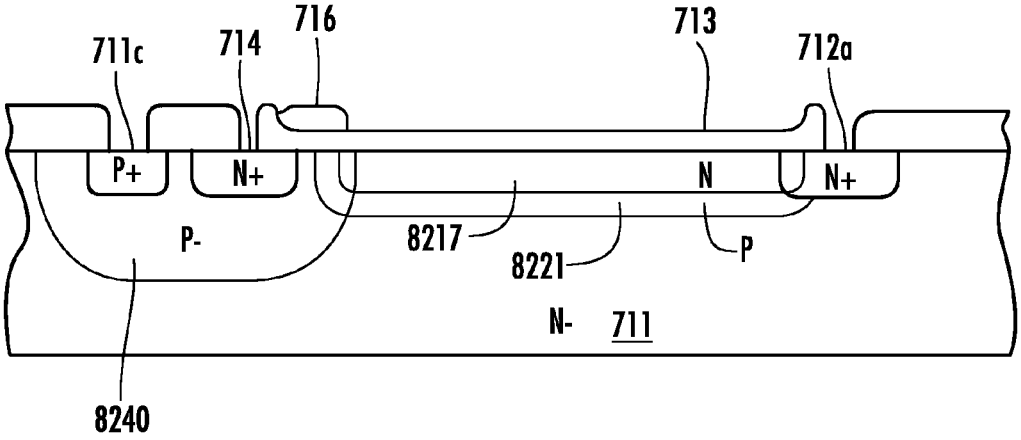
*FIG. 10 is a cross-section of a LDMOS device made in accordance with still another embodiment of the present invention.*

*Still another embodiment, as illustrated in FIG. 10, provides no gap between the $P^-$ body 8240 and the P region 8221 adjacent to the channel edge. The absence of the gap prevents current from flowing in the $N^-$ body 711; so the entire drift region current path is in the N first drift region 8217. Elimination of the gap also allows the device structure to be made smaller. As with the other structure, the N and P regions may be self-aligned to the gate edge, as illustrated in FIG. 10, or not self-aligned. They may also be covered by thick or thin oxide as a design option.*

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising".

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A complementary integrated circuit structure comprising:
- a first MOS device comprising,
  - a first gate;
  - a source doped to a first conductivity type;
  - a drain extension doped to the first conductivity type separated from the source by the first gate;
  - a drain contact doped to the first conductivity type; and
  - an extension region doped to a second conductivity type underlying at least a portion of the drain extension adjacent to the first gate;
- a second complementary MOS device comprising,
  - a second gate;
  - a dual drain extension structure; and
- an island doped to the first conductivity type underlying the first gate and the second gate,
- wherein,
- the drain contact of the first MOS device contacts the island; and
- the first conductivity type is one of N-type and P-type, and the second conductivity type is the other one of N-type and P-type.

2. The complementary integrated circuit structure according to claim 1, wherein the drain extension in the first MOS device is formed from a layer that forms a drain extension in the second complementary MOS device.

3. The complementary integrated circuit structure according to claim 1, wherein the extension region in the first MOS device is formed from a layer that forms an extension region in the second complementary MOS device.

4. The complementary integrated circuit structure according to claim 1 wherein first MOS device further comprises:
- a body contact contacting the extension region and doped to the second conductivity type; and
- the drain contact further contacts the drain extension.

5. The complementary integrated circuit structure according to claim 1 further comprising:
- a field region disposed adjacent to the drain extension.

6. The complementary integrated circuit structure according to claim 1, wherein the drain extension has a net doping concentration of about 5E11 ions/$cm^2$ to about 1.5E12 ions/$cm^2$.

7. The complementary integrated circuit structure according to claim 1, wherein the extension region has a net doping concentration of about 1E12 ions/$cm^2$ to about 3E12 ions/$cm^2$.

8. The complementary integrated circuit structure according to claim 1 further comprising:
- a link layer doped to the first conductivity type contacting the drain extension and a channel disposed under the gate, wherein the link layer has a higher dopant concentration than the drain extension.

9. The complementary integrated circuit structure according to claim 1 further comprising:
- a well doped to the second conductivity type surrounding the source.

10. The complementary integrated circuit structure according to claim 8, wherein the link layer has a length of about 0.5 μm to about 5.0 μm.

11. The complementary integrated circuit structure according to claim 1 wherein the extension region surrounds the drain extension.

12. A complementary integrated circuit structure comprising:
- a first MOS device comprising,
  - a first gate;
  - a first source doped to a first conductivity type;
  - a drain contact doped to the first conductivity type; and
  - a single drain extension separated from the first source by a first gate; and
- a second complementary MOS device comprising;
  - a second gate;
  - a second source doped to a second conductivity type;
  - a dual drain extension separated from the second source by a second gate,
- an island doped to the first conductivity type underlying the first gate and the second gate,
- wherein the first conductivity type is one of N-type and P-type, and the second conductivity type is the other one of N-type and P-type.

13. The complementary integrated circuit structure according to claim 12, wherein the single drain extension comprises a layer that is also used in the dual drain extension.

14. The complementary integrated circuit structure according to claim 12, wherein the single drain extension totally depletes at a reverse drain to body bias before breakdown occurs at a drain extension to body junction under an edge of the first gate.

15. The complementary integrated circuit structure according to claim 12, further comprising:
- a link layer doped to the first conductivity type contacting the single drain extension and a first channel disposed under the first gate, wherein the link layer has a higher dopant concentration than the drain extension.

16. The complementary integrated circuit structure according to claim 15, wherein the single drain extension totally depletes at a drain to body reverse bias below that at which a link layer to body junction under an edge of the first gate breaks down.

17. The complementary integrated circuit structure according to claim 12, wherein the first source is disposed in a first well doped to the second conductivity type.

18. The complementary integrated circuit structure according to claim 12, wherein the first MOS device and the second complementary MOS device have a breakdown voltage greater than about 50V.

19. The complementary integrated circuit structure according to claim 17, wherein a portion of the single drain extension is disposed in the first well.

*20. An integrated circuit structure comprising:*

*a first MOS device comprising,*

*a first gate;*

*a first source doped to a first conductivity type;*

*a first drain extension formed in a first layer, the first drain extension doped to the first conductivity type and separated from the first source by at least a portion of the first gate; and*

*a first well region formed in a second layer underlying the first source and at least a portion of the first drain extension, the first well region doped to a second conductivity type; and*

*the first MOS device further comprising a body contact formed in the first well region adjacent to the first source; and,*

*at least a second MOS device comprising either a first region made from the first layer or a second region made from the second layer.*

*21. The integrated circuit structure of claim 20, wherein the first well region is formed within a third layer doped to the first conductivity type.*

*22. The integrated circuit structure of claim 21 further comprising a first drain contact doped to a first conductivity type abutting the first drain extension and abutting the first region.*

*23. The integrated circuit structure of claim 21, wherein at least a portion of the first well between the first drain extension and the third region depletes at a first drain to a first well voltage below a breakdown voltage of the first MOS device.*

*24. The integrated circuit structure of claim 23, wherein a portion of the first well region doped to the second conductivity type between the first drain extension doped to the first conductivity type and the third region doped to the first conductivity type depletes due to a combined extension of depletion layers into opposite sides of the first well region from at least one PN junction between the first drain extension to first well region and between the third region and first well region.*

*25. The integrated circuit structure of claim 20, the first MOS device further comprising:*

*a first drain contact doped to the first conductivity type formed in the first well region abutting the first drain extension and separated from the gate by a portion of the first drain extension.*

*26. The integrated circuit structure of claim 25, wherein the first drain extension depletes at the first drain to a first well bias voltage less than a breakdown voltage of the first MOS device.*

*27. The integrated circuit structure of claim 20, further comprising a first link region doped to the first conductivity type adjacent to the first gate at a first edge and abutting the first drain extension at an opposite edge.*

*28. The integrated circuit structure of claim 20, further comprising a second well doped to the second conductivity type below at least the first source and the first gate.*

*29. The integrated circuit structure of claim 20, wherein the at least a second MOS device comprises a first region made from the first layer and a second region made from the second layer.*

* * * * *

UNITED STATES PATENT AND TRADEMARK OFFICE

CERTIFICATE OF CORRECTION

PATENT NO. : RE44,430 E
APPLICATION NO. : 13/291302
DATED : August 13, 2013
INVENTOR(S) : James D. Beasom It is certified that error appears in the above-identified patent and that said Letters Patent is hereby corrected as shown below:

Title page, item [75] inventor: should read as follows: James D. Beasom, Melbourne Village, FL (US).

Signed and Sealed this
Eleventh Day of August, 2015

Michelle K. Lee

Michelle K. Lee
*Director of the United States Patent and Trademark Office*